United States Patent [19]

Engeler et al.

[11] 4,124,862

[45] Nov. 7, 1978

[54] CHARGE TRANSFER FILTER

[75] Inventors: William E. Engeler, Scotia; Jerome J. Tiemann, Schenectady, both of N.Y.

[73] Assignee: General Electric Company, Schenectady, N.Y.

[21] Appl. No.: 775,662

[22] Filed: Mar. 8, 1977

Related U.S. Application Data

[63] Continuation of Ser. No. 618,838, Oct. 1, 1975, abandoned.

[51] Int. Cl.² .................... H01L 29/78; G11C 19/28
[52] U.S. Cl. ................................ 357/24; 307/221 D
[58] Field of Search ............. 357/24; 307/221 D, 304

[56] References Cited

U.S. PATENT DOCUMENTS

| | | | |
|---|---|---|---|
| 3,643,106 | 2/1972 | Berwin et al. | 357/24 |
| 3,763,480 | 10/1973 | Weimer | 357/24 |
| 3,777,186 | 12/1973 | Chang | 357/24 |
| 3,801,883 | 4/1974 | Tiemann | 357/24 |
| 3,858,232 | 12/1974 | Boyle et al. | 357/24 |
| 3,864,722 | 2/1975 | Carnes | 357/24 |
| 3,876,952 | 4/1975 | Weimer | 357/24 |
| 3,902,186 | 8/1975 | Engeler et al. | 357/24 |
| 3,937,985 | 2/1976 | Cooper | 357/24 |

Primary Examiner—Stanley D. Miller, Jr.
Assistant Examiner—Gene M. Munson
Attorney, Agent, or Firm—Julius J. Zaskalicky; Joseph T. Cohen; Marvin Snyder

[57] ABSTRACT

A charge transfer filter includes an accumulator charge storage location and means for alternately introducing charge into the accumulator charge storage location and then for removing a preselected fraction of the total charge in the accumulator charge storage location so that the total accumulated charge is known.

2 Claims, 6 Drawing Figures

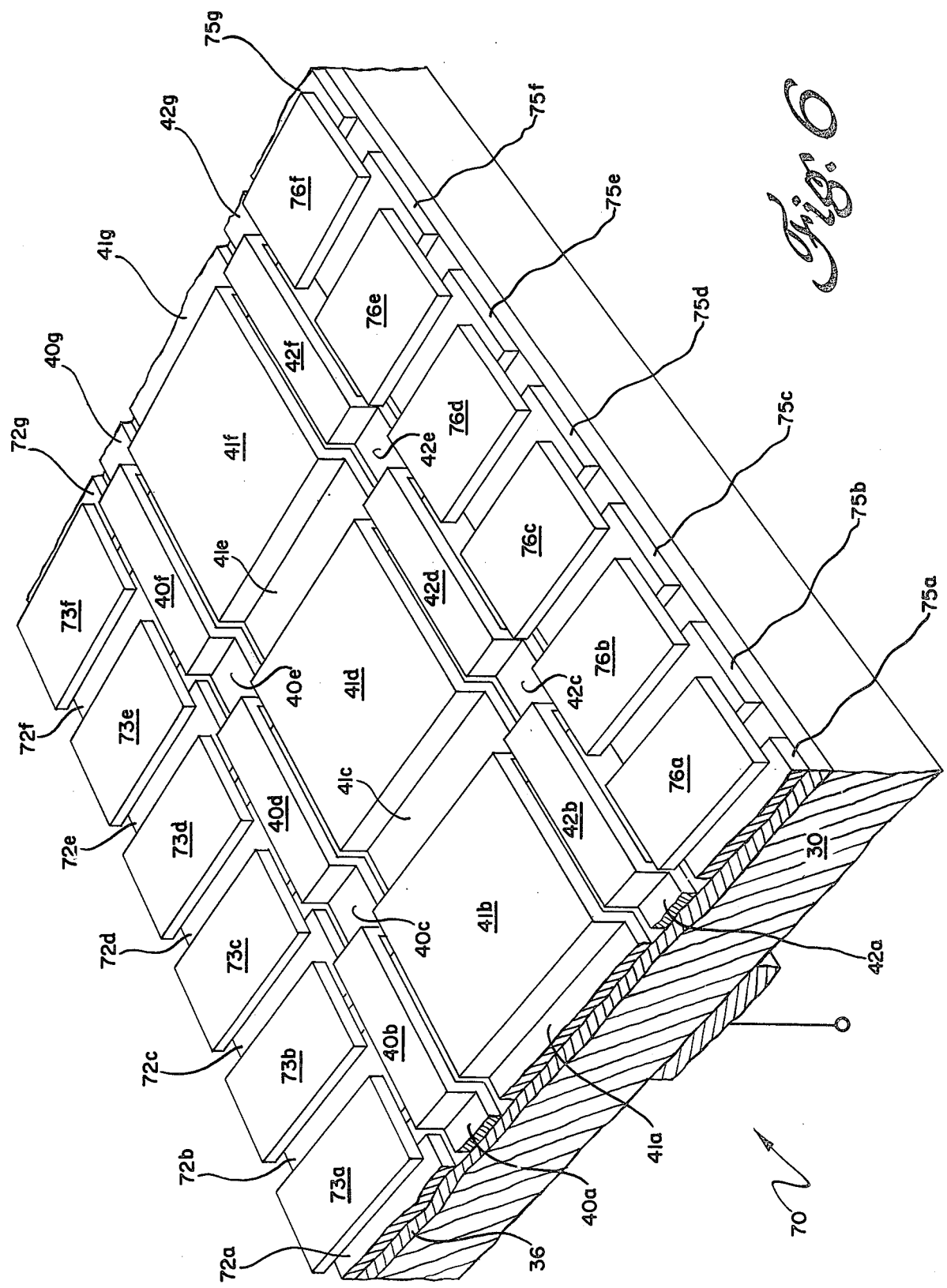

CHARGE TRANSFER FILTER

This is a continuation of application Ser. No. 618,838, filed Oct. 1, 1975, now abandoned.

This invention relates, in general, to a method and apparatus for providing filtering functions with charge transfer devices, and more specifically to a nonrecursive implementation of an exponential smoothing function utilizing a charge transfer structure.

It is often times desirable in analog signal processing applications to provide for the smoothing or averaging of repetitive waveforms. This smoothing or averaging function has as its purpose to provide an output signal free from the random noise present on any particular cycle of the repetitive waveform, but which output may vary at a rate sufficient to reflect changes in the signal itself.

Insofar as is known, only two implementations of this smoothing or averaging function have been heretofore utilized. The first structure includes the use of a delay line memory, as for example, of digital form or of charge transfer type, the output of which is fed back to the input where it is combined with the input signal waveform which represents the successive sample of the repetitive signal. Where desired, the gain of the feedback loop may be adjusted to provide the desired weighting function and further the length of time delay may be adjusted where desired. The output from a filter of this type is taken from the output of the delay line. A second implementation includes the use of individual capacitors and a commutator to store and average successive samples of the repetitive waveform. Resistors connected in parallel with the individual capacitors may be utilized to provide the desired time constant. Each of these prior art methods for implementing a smoothing or averaging filter suffers from certain disadvantages. For example, the recursive structure by virtue of the inclusion of a positive feedback loop cumulates any errors which may be present due to the delay line structure as, for example, charge transfer inefficiencies in either bucket-brigade, surface charge or other charge transfer structures, or frequency or phase nonuniformities as might be expected to be found in lumped constant delay lines. The nonrecursive capacitive structure hereinabove described does not suffer from this enhancement of any errors present in the delay line. It is not, however, as readily suited to varying the time constant as the recursive method.

Accordingly, it is an object of this invention to provide a nonrecursive filter for the exponential smoothing of repetitive waveforms which embodies the advantages both of ease of adjustment of time constant and noncumulation of errors present in the prior art filters hereinabove described.

It is another object of this invention to provide a surface charge transfer filter for the exponential smoothing of repetitive waveforms which may be implemented on a single integrated circuit wafer.

It is yet another object of this invention to provide a surface charge transfer filter which permits variation of the time constant by purely electrical methods.

It is still another object of this invention to provide a surface charge transfer filter having higher accuracy than recursive filters.

Briefly stated, and in accordance with one aspect of this invention, a surface charge transfer nonrecursive filter for the exponential smoothing of repetitive analog waveforms is provided including a semiconductor substrate of a first conductivity type having electrodes associated therewith for forming charge storage locations in the substrate. In accordance with one embodiment of this invention a first ohmic contact is made to one major opposing surface of the substrate, and a plurality of electrical conductors are insulatingly disposed over the other surface of the substrate so that when an electrical potential is applied between the ohmic contact and the insulatingly disposed conductors various depletion regions are formed in the substrate which regions are suitable for the storage of electrical charges at the surface thereof.

In accordance with one embodiment of this invention, an accumulator charge storage location is formed which is adapted to be electrically divided into first and second substantially isolated charge storage locations of preselected relationship to the size of the total accumulator charge storage location with means for controllably erecting a surface potential barrier between them. In this way charge may be introduced into the accumulator charge storage location, the charge in the accumulator storage location divided by erecting a potential barrier, and charge removed and sensed in one of the resulting charge storage locations which is a preselected fraction of a total charge in the accumulator charge storage location thus providing an indication of the magnitude thereof. In accordance with further embodiments of this invention, there will be described surface charge transfer filters including input and output shift registers for providing a plurality of charge samples of an input analog signal which samples are applied to a like plurality of accumulators as hereinabove described. Output shift registers reassemble the charge samples from the selectively isolated portions of the accumulator charge storage locations forming a sequence of samples to provide an output signal which is the desired exponentially smoothed function of the input signal. A further embodiment of this invention will be described wherein the size of the accumulator charge storage location is electrically variable to provide an electrically variable filter function without the need for physically changing the components thereof.

In another mode of operation, the function of summation, rather than smoothing, is performed. In this mode a sample is removed only after a plurality of input samples has been stored.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 6 is a perspective section view of a portion of a charge transfer filter for exponential smoothing in accordance with this invention.

Figure 1:
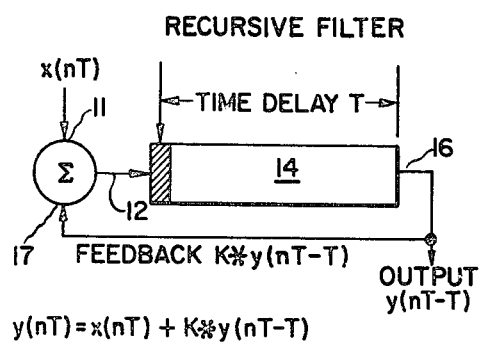
FIG. 1 is a block diagram of a recursive filter of the type utilized in the prior art.

The operation of a surface charge transfer filter in accordance with this invention may be most readily understood by first considering the theoretical mode of operation of such a filter. FIG. 1 illustrates in block diagram form a recursive filter for exponential smoothing of a periodic input signal of the type well known in the prior art. A sampled, periodical input signal, $x(nT)$, is applied to the input of a summing node 11 an output 12 of which is applied to the input of delay line 14 having a delay time equal to T. As was hereinabove described, delay line 14 could take a variety of physical forms including charge transfer delay lines and lumped constant delay lines. An output 16 of delay line 14 is fed back to another input 17 of summing node 11. The feedback path from output 16 to input 17 is considered to have a weighting constant K. As illustrated at FIG. 1, the input to summing node 11 may be represented as $x(nT)$, the output 12 of summing node 11 may be represented as $y(nT)$, and the output of delay line 14 may be represented as $y(nT - T)$. The feedback path provides a signal at input 17 of summing node 11 equal to $K * y(nT - T)$. The difference equation for the structure of FIG. 1 may be written as $$y(nT) = x(nT) + K * y(nT - T).$$

Figure 2:
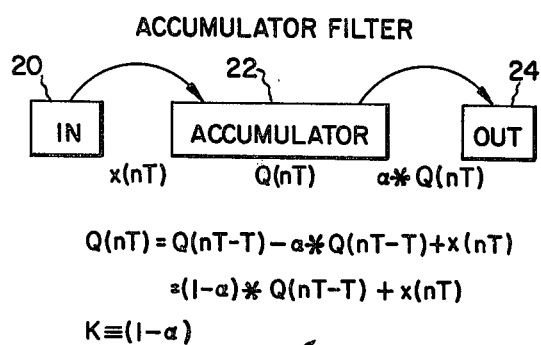
FIG. 2 is a block diagram of an accumulator type filter in accordance with this invention.

A block diagram of an accumulator type filter embodying the same function as the recursive filter of FIG. 1 is illustrated in FIG. 2. An input stage 20 supplies a first signal represented by $x(nT)$ to an accumulator 22 the contents of which may be represented at any instant in time by $Q(nT)$. The output of accumulator 22 is a preselected fraction thereof represented by the factor $\alpha$ and the output may therefore be represented as $\alpha*Q(nT)$ and is removed from the accumulator, and applied to output stage 24. The filter function of the structure of FIG. 2 may be readily determined by considering the contents of accumulator 22 at a given instant in time. It can be seen that $Q(nT)$ is equal to the sum of the contents of the accumulator at the previous time, $(nT - T)$, and the signal added by input stage 20, $x(nT)$ less the signal transfer to output stage 24, $\alpha*Q(nT - T)$ or:

$$Q(nT) = Q(nT - T) - \alpha*Q(nT - T) + x(nT)$$

which may be readily rearranged to yield:

$$Q(nT) = (1 - \alpha)*Q(nT - T) + x(nT)$$

which can be seen to be the equivalent of the difference equation for the recursive filter of FIG. 1 where:

$$K = (1 - \alpha).$$

The implementation of a nonrecursive filter in accordance with the block diagram illustrated in FIG. 2 requires two signal functions which are especially well adapted to be implemented by surface charge transfer technology. The first function is the addition of a signal sample, in this case a charge sample, to a reservoir containing a specified signal sample (charge sample) from prior operations. The second function is the splitting of a signal sample into two portions of predetermined ratio thereby allowing a small portion of a signal sample to be removed and utilized to provide an output which represents an accurately determinable portion of the stored sample. Both of these functions are readily obtainable in surface charge transfer devices.

Figure 3:
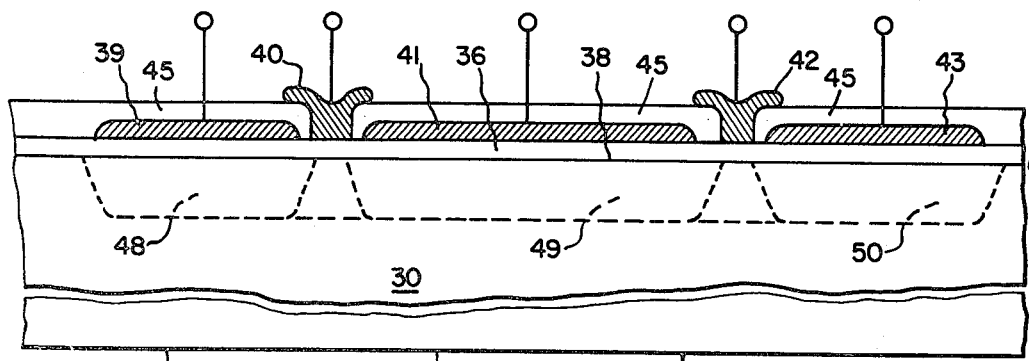
FIG. 3 is a partial section view of a single stage of a charge transfer filter for exponential smoothing in accordance with this invention.

A single state of a surface charge transfer filter in accordance with this invention and which illustrates the two charge transfer operations hereinabove described is illustrated in FIG. 3. A semiconductor substrate 30 is provided having at least one ohmic contact 32 to a first major surface 34 thereof. It is to be understood that ohmic contact 32 may be formed in a number of ways as will be appeciated by one skilled in the art, for example, but not limited to a metallic contact directly bonded or alloyed to semiconductor substrate 30, or by providing a heavily doped layer of semiconductor material which contacts major surface 34 and which has a metallic contact attached thereto. The precise method for making ohmic contact to semiconductor substrate 30 is not critical to the operation of this invention and may be practiced in accordance with well known semiconductor device fabrication techniques. Semiconductor substrate 30 itself may be either of p-type or n-type semiconductor material as desired, it being understood that the choice of conductivity type will dictate the polarity of the various voltages to be applied to the elements of the surface charge transfer filter in accordance with this invention to be hereinbelow described. For purposes of illustrating this invention, it will be assumed that substrate 30 is of n-type silicon material. It is to be understood that while silicon will be utilized for purposes of illustrating this invention, other semiconductor materials well known to those skilled in the art may be satisfactorily utilized. A thin insulating layer 36 overlies second major opposing surface 38 of semiconductor substrate 30. Insulating layer 36 may conveniently be formed of silicon dioxide, for example, by exposing substrate 30 to an oxidizing atmosphere. Other insulating layers as are well known in the art such as layered silicon nitride ($Si_3N_4$) over silicon dioxide ($SiO_2$) may equally well be employed if desired and this invention is not intended to be limited to any specific type of insulating layer. It is, of course, required that insulating layer 36 be of sufficient thickness, depending upon the material employed, to withstand the voltages to be applied to the electrodes which will overlie it. Electrical conductors 39, 40, 41, 42 and 43 overlie insulating layer 36. Electrical conductors 39, 41 and 43 are operative to form the charge storage location to be hereinbelow described, while conductors 40 and 42 are operative to perform the input and output functions. Electrical conductors 39 through 43 are formed by any of the well known techniques for forming conductive regions on insulating materials in semiconductor structures. For example, the entire surface of insulating layer 36 may be coated with a suitable metal or conductive semiconductor and then etched to remove the coating from all but the desired location. Any of a number of well known metals and semiconductors may be utilized to form conductors 39 through 43 as, for example, silicon, molybdenum, tungsten, aluminum or any other of the other numerous conducting materials capable of withstanding the thermal stresses normally encountered in semiconductor fabrication processes. It will be recognized by reference to FIG. 3 that conductors 39, 41 and 43 are illustrated as lying in a first plane, while conductors 40 and 42 are illustrated as overlapping conductors 39, 41 and 43 and separated therefrom by an insulating layer 45. This structure may be desirable in order to reduce the required manufacturing tolerances during the fabrication of a device in accordance with this invention, but it is to be understood that this particular structure is not required and where desired conductors 40 and 42 may be formed in the same way as conductors 39, 41 and 43. Generally, a passivating layer would overlie insulating layer 45 and conductors 40 and 42 to provide, as is well known, protection for the completed device from undesirable oxidation of the various elements thereof. It is to be understood further that appropriate means for making electrical connection to conductors 39 through 43 must be provided as, for example, by connecting wires to the individual conductors or by additional conductors of the same type contacting these conductors through "via" holes in the insulating layers as is well known.

The operation of the surface charge transfer filter may be most readily understood by referring now to that portion of FIG. 3 wherein depletion regions 48, 49 and 50 are illustrated. These regions are formed in semiconductor substrate 30 by the application of appropriate voltages between the electrical conductors hereinabove described. For example, the application of a negative voltage between the electrical conductors 39 and 32 will create an electric field therebetween which electric field will create a depletion region extending from the surface 36 of semiconductor substrate 30 towards the opposing surface 34 thereof. The physical depth of depletion region 48 will depend, of course, upon the magnitude of the electric field created and upon the impurity concentration of the substrate 30. The formation of depletion region 48 produces a region near the surface 38 of substrate 30 substantially devoid of minority characters. During the time period between the formation of the depletion region and the intended removal of minority carriers from the surface of the semiconductor substrate and the replacement of those minority carriers by thermal generation, there is formed a region near the surface suitable for the storage of electrical charge. Charge may be introduced by any of a number of methods as, for example, through the use of a pn junction contact, avalanching, or through photoexcitation. This invention is not restricted to any particular means for creating the electrical charge to be stored in the charge storage locations thereof, and therefore any of the methods for generating charge well known to those skilled in the art may be utilized.

Charge storage locations 49 and 50 are formed underlying electrical conductors 41 and 43 in the same manner as hereinabove described in conjunction with electrical conductor 39 and depletion region 48. Electrical conductors 40 and 42 provide as will be hereinbelow described for the transfer of charge among the three regions for the storage thereof and also for the selective isolation of these regions in accordance with this invention. Assume, for example, that a charge is stored at the surface of semiconductor substrate 30 underlying electrical conductor 39. Assume further that the appropriate voltages have been applied to the electrical conductors 41 and 43 to form surface charge storage locations thereunder. The transfer of charge from one charge storage location to another may be most readily understood by recognizing that although the depletion regions underlying the various electrical conductors are shown as potential wells, that the charge, in fact, exists on the surface of the semiconductor substrate and is readily mobile from one surface storage location to another depending upon the surface charge potential distribution. It can be seen therefore that if the potential at the surface of the semiconductor substrate underlying conductor 41 is lower than that of the surface underlying conductor 39 that charge will flow from the storage region underlying conductor 39 to the storage underlying conductor 41. Control conductor 40 is operative to selectively create or remove a potential barrier between the two charge storage locations in order to allow or inhibit charge transfer. An example will illustrate this process. Assume that conductor 39 is maintained at a potential of −10 volts, while conductor 41 is maintained at a potential of −20 volts. It can be seen that absent other considerations charge would tend to flow from the region underlying conductor 39 to the region underlying conductor 41. If, however, conductor 40 is maintained at a potential below threshold, for example, of 0 volts, a barrier will be created between the charge storage locations underlying conductors 39 and 41 and inhibit the flow of charge therebetween. If, however, the voltage on conductor 40 is increased to −20 volts, charge will flow from the charge storage location underlying conductor 39 to the charge storage location underlying conductor 41. Further, it can be seen that there will be a substantially complete transfer of charge even if, as was hereinabove described, charge was previously present in the charge storage locations underlying conductor 41. This process for transferring charge from a first charge storage location to a second charge storage location already containing a charge sample is fundamental to the operation of this invention. After the transfer of charge is complete, the potential applied to conductor 40 is reduced to 0 volts and a subsequent charge sample may be placed in the charge storage location underlying conductor 39. The operation of conductor 42 is to control the flow of charge between the charge storage location underlying conductor 41 and that underlying conductor 43. In operation conductor 42 assumes two states, a first state such that a substantially continuous charge storage location exists underlying conductors 41 and 43, and a second state such that the charge storage locations underlying conductors 41 and 43 are substantially isolated. It will be appreciated that a continuous charge storage location may be obtained by applying a potential to conductor 42 which is equal to or substantially equal to the potential applied to conductors 41 and 43 thereby creating a continuous depletion region underlying each of conductors 41, 42 and 43. In a manner similar to that hereinabove described in conjunction with conductor 40 decreasing the voltage applied to conductor 42 toward zero volts creates an electrical barrier between the charge storage location underlying conductors 41 and 43. The charge in the charge storage location underlying conductor 43 may then be measured or removed as desired in the particular application to which this invention is applied.

It may be seen that the structure illustrated in FIG. 3 is readily suited to performing the functions hereinabove described in conjunction with FIG. 2. An exemplary signal processing function will serve to illustrate the process. Assume that a steady-state condition has been reached and that a charge sample is present in the charge storage location underlying conductor 41. This charge storage sample has represented in FIG. 2 as Q(nT−T). The structure is ready to receive a new charge sample, and the voltage on conductor 40 is adjusted to 0 volts so that the charge storage region under conductor 39 is isolated from the remainder of the structure. A new charge sample is introduced into the charge storage location underlying conductor 39 and the barrier underlying conductor 40 is lowered by increasing the voltage on conductor 40 so that the charge sample underlying conductor 39 flows into the charge storage location underlying conductors 41 and 43. The electrical potential applied to conductor 42 during this period is equal to the electrical potential applied to conductors 41 and 43 thereby creating as was hereinabove described a single charge storage location underlying conductors 41, 42 and 43. After the charge sample transferred into the charge storage location comprising the areas under conductors 41 through 43 have been completed, the voltage on conductor 42 is lowered toward 0 volts until the portion of the charge underlying conductor 43 is isolated from the remainder of the structure. This charge may then be removed and measured or utilized to provide a signal as will be hereinbelow described. The quantity of charge isolated by conductor 42 which underlies conductor 43 is a precise and predetermined fraction of the total charge present in the charge storage location comprising the areas under conductors 41, 42 and 43 just prior to isolation of the charge storage location underlying conductor 43. It can be seen that the relationship between these charges may be expressed as $$Q_{out} = Q_{total} \times (A_{43}/A_{41} + A_{43})$$

where $Q_{out}$ corresponds to $\alpha Q(nT)$ in FIG. 2 and is the charge present underlying conductor 43 and $Q_{total}$ is the total charge underlying conductors 41 through 43 and $A_{43}$ is the area of conductor 43, $A_{41}$ is the area of conductor 41 and $A_{42}$ is the area of conductor 42. In a preferred embodiment of this invention, the areas of conductors 41 and 43 are substantially larger than the area of conductor 42 and therefore the area of conductor 42 may conveniently be ignored. Charge stored under this electrode prior to isolating of the charge stored below conductor 43 will be divided between storage regions 49 and 50. A more exact equation for would therefore include a portion of the area of 42 in the areas of 43 and 41. It will be appreciated that the coefficient $\alpha$ of FIG. 2 corresponds to the ratio of the areas of conductor 43 to conductors 41 + 43 in FIG. 3.

While this invention is not limited to any specific ratio between the charge storage locations and therefore to any specific magnitude for the factor $\alpha$, limitations in processing technologies utilized to implement this invention in physical form make it preferable that certain limitations be observed. It may, for example, be preferred that a single semiconductor die not exceed 200 mils by 200 mils in order that a satisfactory yield be maintained. Further, in order to obtain satisfactory accuracy for the area of conductor 43 at least 1 mil of length may be preferred. In such case, the area ratio of conductor 43 to conductor 41 should be kept below 1:200. It is to be understood, as will be discussed in conjunction with FIG. 6, that a series of elements of the type illustrated in FIG. 3 will be utilized in a practical embodiment of this invention.

Figure 4:
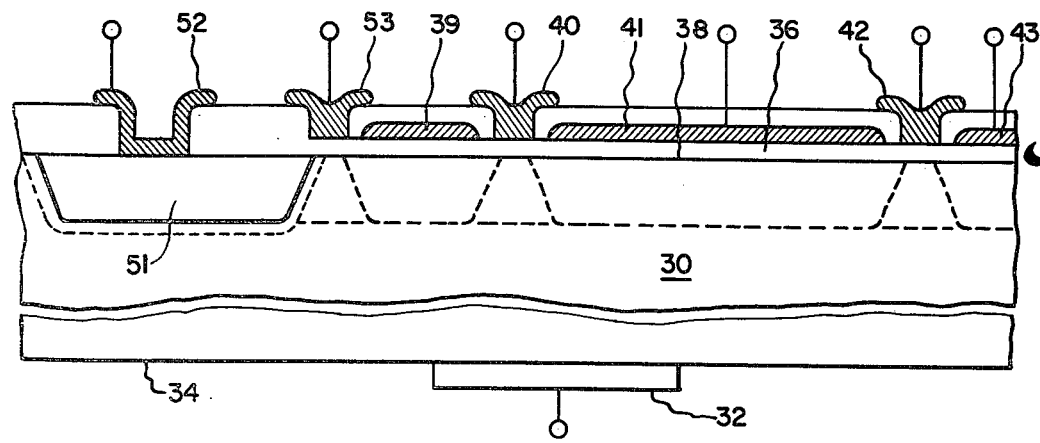
FIG. 4 is a section view of a single stage of a charge transfer filter for exponential smoothing in accordance with another aspect of this invention.

FIG. 4 illustrates in a section view an alternative embodiment of this invention. A number of the elements of the embodiment of this invention of FIG. 4 substantially correspond to elements illustrated hereinabove at FIG. 3. Like numbered elements are given like reference numerals for purposes of ease of illustration and understanding. For example, a substrate 30 is provided having a first electrical connection 32 made to one major surface thereof and a plurality of electrical conductors 39 through 43 insulated from a second major surface 38 of semiconductor substrate 30 by an insulating layer 36. The operation of that portion of the embodiment of this invention illustrated in FIG. 4 which corresponds to the embodiment of FIG. 3 operates in substantially the same manner and the discussion in conjunction with FIG. 3 will not be repeated here. FIG. 4 illustrates an exemplary embodiment of this invention for producing charge samples in the charge storage region underlying conductor 39. An input diffusion 50 of conductivity type opposite to that of the substrate extends from the surface 38 of semiconductor substrate 30 down towards but not meeting the opposing surface 34 thereof. Methods for forming diffusions in semiconductor substrates are well known and will not be set forth herein. Suffice it to say that any of the well known techniques for forming regions of opposite conductivity type in semiconductor substrates may be utilized as, for example, masking and exposure to atmospheres containing the desired impurity atoms at temperatures and pressures suitable to cause diffusion into the substrate. A metallization 52 provides ohmic contact to diffusion 51 for the application of bias and signal inputs thereto. It is to be noted that in contradistinction to conductors 39 through 43 metallization 52 extends through insulating layer 36 and makes intimate contact with diffused region 50. The application of an analog signal to metallization 52 in conjunction with the appropriate bias voltage sets the quasi-Fermi level for minority carriers in the neighborhood of the diffusion region to the voltage of the analog signal. An electrical conductor 53 which overlies insulating layer 36 and functions in a fashion substantially identical to electrical conductors 40 and 42 hereinabove described controls the flow of charge into the charge storage region underlying electrical conductor 39. As was hereinbefore described, it is necessary that the surface charge potential at the surface of the semiconductor substrate underlying conductor 53 be lower than that at the diffusion in order that charge will flow when a voltage is applied to conductor 53 which permits the flow charge. As was hereinbefore described, the application of a negative voltage to conductor 53 allows charge to flow into the charge storage location underlying conductor 39 until the surface potential has risen to the level of the input diffusion voltage. It can be seen, therefore, that the structure of FIG. 4 provides a convenient method for providing input charge samples to the charge storage location underlying conductor 39.

Figure 5:
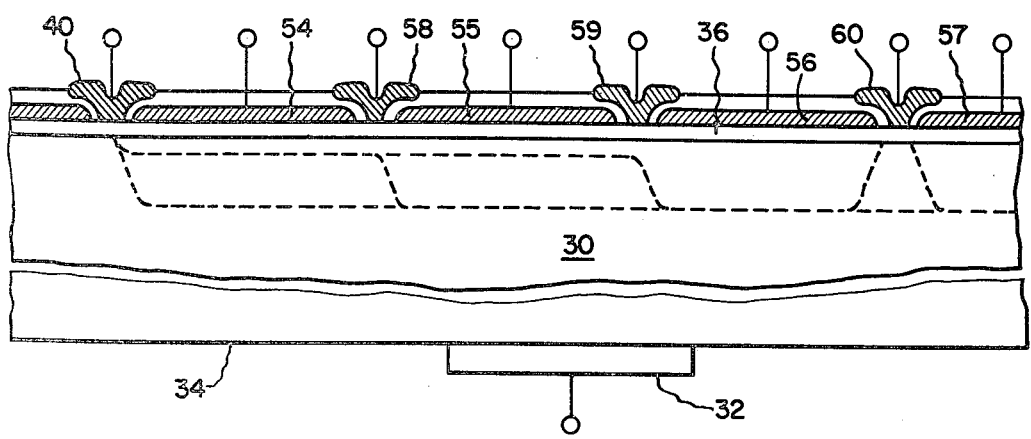
FIG. 5 is a section view of a charge transfer filter for exponential smoothing in accordance with yet another embodiment of this invention.

In accordance with another embodiment of this invention there is illustrated in FIG. 5 a surface charge transfer filter structure for the exponential smoothing of repetitive analog waveforms which allows wholly electronic selection of filter time constant. The time constant of a filter in accordance with this invention is related to the ratio of the area of the output charge storage location to the total accumulator charge storage location. In accordance with this invention, the output charge storage location is intended to describe that portion of the accumulator charge storage location which is isolated from the remaining portion and which is thereafter utilized to provide charge for the output of the device. The accumulator charge storage location includes the output charge storage location and additionally that portion of the device in which the charge samples are continuously accumulated. Referring to FIG. 5 there is shown a structure in accordance with this invention for electrically varying the area of the accumulator. FIG. 5 does not illustrate as was shown in FIG. 4 any structure for introducing the charge samples into the accumulator and admits further any input sampling storage region. Only the accumulator and the isolatable output charge storage location are illustrated. The accumulator includes electrical conductors 54, 55, 56 and 57, the output charge storage location underlying electrical conductor 57. Electrical conductors 54 through 57 are separated by electrical conductors 58 through 60, electrical conductor 60 performing a function analogous to electrical conductor 42 in FIGS. 3 and 4. Electrical conductors 58 and 59 perform a somewhat different function and are utilized to electrically vary the physical size of the accumulator charge storage location. For example, assume that an electrical charge sample is to be placed in the accumulator. In order to achieve an accumulator having the largest ratio of total accumulator area to output area electrical potentials are supplied to electrodes 54 through 57 and 58 through 60 of the same magnitude so that a uniform potential exists at the surface of substrate 30. After charge has completely flowed into the charge storage location underlying electrical conductors 54 through 60 a voltage applied to electrical conductor 40 is lowered to 0 volts as was illustrated hereinabove and further charge is prevented from flowing into or out of the accumulator charage storage location. After a further time during which the charge in the accumulator charge storage location equilibrates, that is to say for the time it takes for the surface charge to become uniform over the surface encompassed by the accumulator charge storage location, the voltage on conductor 60 is raised to, for example, 0 volts substantially isolating the output charge storage location underlying conductor 57 from the remainder of the accumulator charge storage location. The charge in the output charge storage location may then be delivered to a sense node, for example, for further utilization as will be hereinbelow described. Where it is desirable to reduce the filtering time constant the ratio between the area of the output charge storage locations and the accumulator charge storage location must be made larger. This may be accomplished in accordance with this invention by, for example, setting the voltage on electrical conductor 54 higher than the voltage on electrical conductors 58, 55, 59, 56, 60 and 57 so that no charge will be stored on the surface of the semiconductor substrate underlying conductor 54. The total accumulated charge storage location will then include only the areas underlying electrical conductors 55 59, 56 and 60. FIG. 5 illustrates in conceptual form the surface potentials underlying the various electrodes. It will be appreciated that while these potentials are shown in FIG. 5 as wells, that no such wells exist and that the charge is, in fact, stored at the surface of semiconductor substrate 30. It can be seen that through the application of proper voltages to the electrical conductors insulatingly overlying semiconductor substrate 30, the ratio of the areas underlying the accumulator electrical conductors to the area underlying the output charge storage location electrical conductor may be varied as shown. Specifically, the accumulator charge storage location may include areas underlying electrodes 54, 55 and 56, or only 55 and 56, or only 56. It is emphasized that while only three electrical conductors are illustrated at FIG. 5 that this invention is not so limited and a larger number of conductors may be employed where desired in order to obtain a larger degree of flexibility of filtering time constant.

It will be further appreciated that the output charge storage location may be increased in size through the use of the same techniques as hereinabove described. For example, where it is desired to increase the ratio of output charge storage location to a total accumulator charge storage location electrical conductor 59 may appropriately be connected as the isolating conductor and conductor 60 will therefore be connected to the same voltage as conductors 56 and 57. It will be appreciated that a large number of combinations of total accumulator and output charge storage locations are possible.

FIGS. 3, 4 and 5 hereinabove described have illustrated single stages of a charge transfer filter in accordance with this invention. The operation and cooperation of a plurality of stages of the type illustrated in FIGS. 3 through 5 may be most readily understood by referring now to FIG. 6 wherein a portion of a charge transfer filter in accordance with this invention is illustrated in perspective form. The filter, indicated generally at 70, includes three major structural elements for forming charge storage locations and two control elements for regulating the transfer of charge therebetween. An input surface charge transfer shift register comprises a first plurality of laterally spaced apart electrodes insulatingly disposed over semiconductor substrate 30 by insulating layer 36. The first plurality of laterally spaced apart electrodes 72a, c, e and g are operative upon the application of a suitable voltage, depending upon the type of semiconductor substrate utilized, to form surface charge storage locations thereunder. A second plurality of electrodes 73a–f and 72b, d and f is operative to control the transfer of charge between the charge storage locations underlying electrodes 72a, c, e and g. The operation of surface charge transfer shift registers is well known in the art and a detailed explanation will not be presented herein. If a more detailed description and explanation is desired, reference may conveniently be made to U.S. Pat. No. 3,795,847 to Engeler and Tiemann for METHOD AND APPARATUS FOR STORING AND TRANSFERRING INFORMATION, the contents of which are herein incorporated by reference. It will be appreciated by one skilled in the art and with reference to the referenced United States patent that surface charge transfer shift registers may be embodied in a number of physical forms. This invention is not limited to any particular form of shift register structure and requires only that the form employed provide a series of laterally spaced apart charge storage locations thereunder. As is well known surface charge transfer shift registers may employ clock oscillators of one, two or more phases for providing unidirectional charge transfer. The surface charge transfer filter of FIG. 6 illustrates a shift register structure suitable for control by a one phase clock if desired. The surface charge transfer shift register illustrated in the embodiment of this invention of FIG. 6 omits any input of output shift register phases. It is to be understood by one skilled in the art that to the extent that a large number of methods are known for transforming analog signal to charge samples and for accomplishing the reverse process, and further to the extent that one skilled in the art will appreciate that any of a number of these techniques may be equally well employed in accordance with this invention, the operation and advantages of this invention may most clearly shown by omitting shift register input and output stages. It is assumed therefore that charge transfer filter 70 is but a portion of a device including a large plurality of stages of the type illustrated, and in addition, appropriate input and output stages. The structure of an exemplary input and output stage for a charge transfer device are illustrated, for example, in U.S. Pat. No. 3,770,988 to Engeler et al for SELF REGISTERED SURFACE CHARGE LAUNCH-RECEIVE DEVICE AND METHOD FOR MAKING, the disclosure of which is herein incorporated by reference. Charge packets representing samples of an input analog waveform are sequentially transferred from each charge transfer stage to the next as, for example from 72a to 72b and then to 72c and then to 72d and so on depending upon the number of samples per repetition of the analog waveform to be smoothed. Each repetition of the analog waveform may be seen therefore to be divided into a plurality of charge samples, the magnitude of the samples being proportional to the magnitude of the analog waveform at a particular instant in time. The operation of filter 70 may be more easily understood by observing that it is comprised of a plurality of filters of the type illustrated at FIG. 3. It will be appreciated that a cross section taken through any of stages a, c, e or g of filter 70 will be the structure illustrated at FIG. 3. Electrode 40 of FIG. 6 corresponds to electrode 40 of FIG. 3. Further, electrode 41 corresponds to the like numbered electrode of FIG. 3 as does electrode 42. A second surface charge transfer shift register comprising electrodes 75a through f and 76a through f is the output shift register of the device. It will be observed in the case both of the input and output shift registers that electrodes 73 in the first instance and 76 in the second are spaced vertically from electrodes 72 and 75, respectively. It will be appreciated by one skilled in the art that a layer of insulating material (not illustrated) is required to effect the structure illustrated. FIG. 6 is as will be readily apparent a somewhat simplified structural illustration omitting nonactive insulating regions in the interest of clarity and in order to more effectively illustrate the required active electrodes. Accordingly, therefore, although not illustrated, it will be appreciated by those skilled in the art that the structure illustrated at FIG. 6 would include those omitted insulating layers and suitable passivating layers as are commonly employed in integrated circuit construction. Referring specifically to electrode 41, it will be noted that electrode 41 is a continuous electrode having alternating elevated and depressed regions. These elevations and depressions may be conveniently made by forming electrode 41 over similarly alternating regions of thick and thin oxide as may be readily obtained by etching processes. In operation, a voltage applied to electrode 41 will create surface charge storage regions in semiconductor substrate 30 only under the depressed electrode regions 41a, c, e and g while the electric field produced under elevated electrode regions 41b, d and f will be of insufficient amplitude to form effective charge storage locations thereunder.

As will be recalled from the discussion in conjunction with FIGS. 3 through 5, the ratio between the areas of the charge storage locations underlying electrode 41 and the output surface charge shift register determines the effective filtering time constant of the device. No effort is made in FIG. 6 to accurately depict any specific relationship and the sizes chosen for the electrodes illustrated therein are to a large extent arbitrary in order to most clearly illustrate the structure involved. It will be appreciated that in actual structure in accordance with this invention electrode 41, for example, might tend to be wider (in the direction parallel to electrode 40) and the output shift register somewhat narrower in order to achieve a longer time constant. Further, as was discussed in conjunction with FIGS. 4 and 5 electrode 41 might readily be divided into a plurality of narrow electrodes having the capability to be switchably energized to order to provide a variable time constant.

In operation, a single cycle of a repetitive analog waveform is clocked into the intput shift register and a plurality of charge samples proportional to the time sequential amplitude of the analog signal is created under electrodes 72a, c, e and g. Electrodes 41, 42, 75 and 76 are appropriately energized to order to form a plurality of isolated charge storage locations thereunder. For example, a single charge storage location includes the surface underlying electrodes 41a and 75a. Electrode 40 is now appropriately energized, as for example by applying a negative voltage as was discussed in conjunction with FIG. 3, to permit charge to transfer into the plurality of charge storage locations just described. After transfer is complete, electrode 40 is raised to a potential of, for example 0 volts in order to isolate the input surface charge transfer shift register from the remainder of the structure. The input surface charge register is now in condition to receive a new input signal waveform which will be a successive waveform. After charge has transferred from the input shift register to the large charge storage location and sufficient time has passed for equilibration to occur, electrode 42 is raised to a high potential, for example, 0 volts, in order to isolate a preselected fraction of the total charge in each of the plurality of charge storage locations in the portion of the charge storage locations underlying the output shift register. Since the ratio between the areas of the charge storage locations is known, a known fraction of the total charge is isolated under the shift register electrodes and is in condition to be clocked out of the device sequentially to form a sequential analog signal therefrom. While the samples are being clocked out by the output shift register, the device is in condition to receive the succeeding input signal waveform. It will be appreciated that a portion of the charge representing the first input waveform signal remains in the charge storage location underlying electrode 41 and as was discussed in conjunction FIG. 2 the desired filter function is realized.

While the invention has been hereinabove described in a mode of operation wherein a sample is removed from the accumulator section each time an input sample is inserted, it may be preferred in certain instances to provide an alternate mode of operation wherein a plurality of input samples are accumulated before a sample is removed. In this manner, it is possible to achieve a longer effective time constant than is possible utilizing the same structure in a mode wherein an output sample is taken each time an input sample is added.

Further, while the invention described herein has been illustrated in terms of surface charge transfer storage and transfer structures, other charge transfer structures such as buried channel structures employing a region of opposite conductivity type at one surface such as those described in U.S. Pat. No. 3,902,187 to Engeler and Tiemann for SURFACE CHARGE STORAGE AND TRANSFER DEVICES may be employed.

Still further, while the surface charge embodiments of this invention illustrated may provide a preferred mode of practicing the invention, it will be understood by those skilled in the art that other charge transfer techniques may be employed, as for example, bucket brigade techniques as will be apparent to one skilled in the art. For example, charge storage locations as heretofore described may be embodied in discrete or integrated capacitors of the type formed for example by an electrode insulatingly overlying a region of selected impurity concentration. Field effect transistor switches may be employed to effect the transfer of charge between such capacitors in accordance with the procedures herein above described and to perform the required division of charge between charge storage locations. FIGS. 3-6 with the addition of isolated impurity regions underlying the electrodes which form the surface charge storage locations in those embodiments generally illustrate the structure to be employed in such a discrete or integrated capacitor plus FET embodiment of this invention. Clearly it is also possible to practice this invention in accordance with charge transfer devices where either holes or electrons are stored in the semiconductor material. This invention has been described employing the storage and transport of holes, and it will be appreciated that by changing the semiconductor material from n-type to p-type the storage of electrons may readily be effectuated.

While the invention has been particulary shown and described with reference to several preferred embodiments thereof, it will be understood by those skilled in the art that various changes in form and detail may be made therein without departing from the true spirit and scope of the invention as defined by the appended claims.

What is claimed is:

1. In combination,
    a substrate of semiconductor material of one conductivity type having a major surface,
    means forming a plurality of $n$ first charge storage regions adjacent said major surface of said substrate including a plurality of pairs of a first and a second electrode, each pair of first and second electrodes being in insulated relationship with respect to one another and insulatingly overlying a respective first storage region in said substrate,
    means for developing in succession sequences of first quantities of charge, each sequence having the same number $n$ of first quantities of charge representing a respective sequence of values of a repetitive analog signal, each first quantity of charge of a sequence corresponding to a respective value of said repetitive analog signal, corresponding first quantities of charge in a pair of successive sequences representing corresponding values of said analog signal separated by a fixed period of time,
    a first shift register having $n$ stages, each stage comprising an electrode insulatingly overlying a second charge storage region in said substrate,
    means for serially transferring the quantities of charge in each sequence in succession into the $n$ stages of said first shift register,
    means for transferring the quantities of charge in a sequence from each stage of said first shift register into a respective one of said first storage regions,
    means for periodically dividing the total charge in each of said first storage regions into a first part in a first portion and a second part in a second portion after each transfer of a first quantity of charge into a respective first storage region and the equilibration of the resultant charge in the respective first storage region to provide a sequence of second quantities of charge, the ratio of each second part to a respective total charge being a fixed fraction less than 1, each one of said first electrodes insulatingly overlying a said first portion of one of said first charge storage regions,
    a second shift register having $n$ stages, each stage comprising one of said second electrodes insulatingly overlying a second portion of one of said first charge storage regions,
    means for serially transferring said sequence of second quantities of charge out of said second shift register,
    means for sensing each of said second quantities of charge from said second shift register to obtain an output signal.

2. The combination of claim 1 in which said fixed fraction is set by the ratio of the area of said second electrode overlying said substrate to the total area of said first and second electrodes of said pairs of first and second electrodes and in which the potential on said second electrodes is set at a value equal to the value of the potential on said first electrodes during the dividing of charge in said first storage regions.

* * * * *